US007023695B2

(12) United States Patent
McCollum et al.

(10) Patent No.: US 7,023,695 B2
(45) Date of Patent: Apr. 4, 2006

(54) AIR-GAP INSULATOR FOR SHORT-TERM EXPOSURE TO A HIGH TEMPERATURE ENVIRONMENT

(75) Inventors: Dave R. McCollum, Cedarville, IL (US); Wayne L. Ehlers, Lanark, IL (US); Michael J. Skarlupka, Freeport, IL (US)

(73) Assignee: Honeywell International, Inc., Morristown, NJ (US)

( * ) Notice: Subject to any disclaimer, the term of this patent is extended or adjusted under 35 U.S.C. 154(b) by 183 days.

(21) Appl. No.: 10/657,779

(22) Filed: Sep. 8, 2003

(65) Prior Publication Data

US 2005/0052844 A1    Mar. 10, 2005

(51) Int. Cl.
*G06F 1/16* (2006.01)
(52) U.S. Cl. ............... 361/689; 361/818; 361/824; 206/521; 174/17 SF
(58) Field of Classification Search ............... 361/679, 361/683, 689, 708–712; 174/48, 50, 175 F, 174/17 VA; 60/239, 734; 312/223.2, 223.3; 248/206.5, 309.4; 166/57, 66.5; 206/52.1; 220/453; 257/686, 689, 727; 73/514.32
See application file for complete search history.

(56) References Cited

U.S. PATENT DOCUMENTS

| | | | | |
|---|---|---|---|---|
| 4,123,707 | A | | 10/1978 | Fujii et al. ............... 324/208 |
| 4,440,219 | A | * | 4/1984 | Engelder .................. 166/57 |
| 4,559,790 | A | * | 12/1985 | Houston ................... 62/259.3 |
| 4,722,026 | A | | 1/1988 | Bennett et al. ............ 361/380 |
| 4,944,401 | A | * | 7/1990 | Groenewegen ............ 206/521 |
| 5,123,538 | A | * | 6/1992 | Groenewegen ............ 206/521 |
| 5,438,162 | A | * | 8/1995 | Thompson et al. ........ 174/52.2 |
| 5,708,565 | A | * | 1/1998 | Fairbanks ................. 361/704 |
| 6,143,978 | A | * | 11/2000 | Ren et al. ................ 174/17 SF |
| 6,220,346 | B1 | * | 4/2001 | Gissler .................... 166/57 |
| 6,771,501 | B1 | * | 8/2004 | Coleman et al. ......... 361/700 |
| 2003/0089512 | A1 | * | 5/2003 | Faltin et al. ............ 174/17 SF |

OTHER PUBLICATIONS

PCT/US2004/029212 mailed Oct. 14, 2005.

* cited by examiner

*Primary Examiner*—Michael Datskovskiy
(74) *Attorney, Agent, or Firm*—McDonnell Boehnen Hulbert & Berghoff LLP (57) ABSTRACT

A packaging system for electronic circuitry is provided. The electronic circuitry may be disposed upon a substrate, which can be encased or otherwise surrounded by one or more components of the packaging system. The packaging system may include (i) an inner housing that can encase or otherwise enclose the substrate within its confines; (ii) an outer housing that in turn encases or encloses the combination of the inner housing and the substrate within its confines; and (iii) one or more gaps positioned between the electronic circuitry, inner housing and outer housing. The gaps may be filled with fluid or solid insulating media. The combination of the inner housing, outer housing, and gaps can insulate the electronic circuitry from the detrimental and destructive heating effects when the packaging system experiences short-term exposure to a high temperature, which thereby allows operability before, during and after such exposure.

9 Claims, 3 Drawing Sheets

AIR-GAP INSULATOR FOR SHORT-TERM EXPOSURE TO A HIGH TEMPERATURE ENVIRONMENT

FIELD

The present invention relates generally to packaging of electronic circuitry, and more particularly, to packaging of electronic circuitry that allows the electronic circuitry to continue operation after exposure to high temperatures for a short period of time. The invention is especially useful in commercial and/or military aviation applications in which high-temperature environmental conditions can exist for short periods of time during aircraft use, such as take-off and landing.

BACKGROUND

With the development of sophisticated electronic components, including those capable of increasing processing speeds and higher frequencies, having smaller size and more complicated power requirements, relatively high internal temperatures can be generated within the electronic components themselves. These high internal temperatures may become more exacerbated as microprocessors, integrated circuits, and other small feature electrical components and systems are integrated into or placed alongside other devices.

Most microprocessors, integrated circuits and other sophisticated electronic components typically operate efficiently only under a certain range of threshold temperatures. Much of the range of threshold temperatures is exhausted by the internal temperature of the electrical components and the radiant temperature of other surrounding electronics. Many modern electronic circuits begin to exhibit problems at external temperatures between about 80 and 100 degrees C., and begin to fail at temperatures barely above 100 degrees C. Consequently, additional environmental temperature conditions acting upon the electrical components can raise the temperature of the components above their operation thresholds, which unfortunately limits using electronic circuitry in many desirable, but harsh environmental condition locations.

Excessive heat generated or applied during operation of these components can not only harm their own performance, but can also degrade the performance and reliability to the point of failure of overall systems that include such components. The increasingly wide range of environmental conditions, including temperature extremes, in which electronic systems are expected to operate, intensifies these negative effects. For instance, when the temperatures of the electronic components rise above the operational-threshold temperatures for even a short time, junctions of silicon devices can fail, solder pads can reflow thereby causing undesirable cold solder joints, thermistors and other temperature sensing components can shift thereby causing the electronics to become inoperable, printed circuit boards and the materials thereof can become malleable and be easily damaged, and other electromechanical failures can occur.

With the increased need for using microelectronic devices under harsh environmental conditions, thermal management becomes an increasingly important element of the design of electronic products. As noted, both performance reliability and life expectancy of electronic equipment are inversely related to the component temperature of the equipment. For instance, a reduction in the operating temperature of a device such as a typical silicon semiconductor can correspond to an exponential increase in the reliability and life expectancy of the device. Therefore, to maximize the life-span and reliability of a component, controlling the device operating temperature within the limits set by the designers is of vital importance.

Many legacy devices and systems use heat sinks to combat the detrimental effects of internal heat dissipation and externally applied heat. Heat sinks are components that facilitate heat dissipation from the surface of a heat source, such as a heat-generating electronic component, to a cooler environment, usually air. The primary purpose of a heat sink is to help maintain the device temperature below the maximum allowable temperature specified by its designer and/or manufacturer.

Limitations exist, however, with the use of heat sinks. First, heat sinks can become large, as heat sinks seek to increase the heat transfer efficiency between the components and the ambient air by primarily increasing the surface area that is in direct contact with the air. In many applications, heat sinks are formed with fins or other structures to increase the surface area of the heat sink to effect heat dissipation from the electronic component through the heat sink and then to the air. The size constraints of the heat sinks and other associated electronic circuitry greatly limit reduction of electronic packaging and thereby hinder placing electronic circuitry in small locations.

Second, due to inefficient heat-sink-to-air heat transfer, damage to the underlying electronic circuitry can occur before the heat sink can react. Furthermore, the heat sink may actually transfer heat into an operating circuit when the external temperature is much greater than the internal heat of the underling circuitry. And as the external temperature is applied to such heat sinks, the heat transfer to the circuitry may be delayed due to the thermal conductivity of the heat sink. Thus, any potential advantages of external temperature sensors used to protect the underlying circuitry may be thwarted.

What is therefore needed is an apparatus and method for protecting and preserving an electronic device or assembly from short-term exposure to a destructive high temperature environment that does not deleteriously constrain size, weight, cost, serviceability and reliability of the electronic components therein.

SUMMARY

A packaging system for electronic circuitry, which may be disposed on a substrate, is provided. The packaging system includes a combination of (i) an inner housing, which may surround the substrate, (ii) an outer housing, which may surround the inner housing and the substrate combination, (iii) and a gap positioned between the inner and outer housings. The gap may be filled with insulating media, such as air. The combination of the inner housing, the outer housing, and the gap allow the electronic circuitry to maintain operability during and after the packaging system experiences short term exposure to a high temperature.

BRIEF DESCRIPTION OF THE DRAWINGS

Exemplary embodiments are described below in conjunction with the appended drawing figures, wherein like reference numerals refer to like elements in the various figures, and wherein.

DETAILED DESCRIPTION OF PRESENTLY PREFERRED EMBODIMENTS

In the following detailed description, numerous specific details are set forth in order to provide a thorough understanding of the invention. However, it will be understood that the present invention may be practiced without these specific details. In other instances, well-known methods, procedures, components and circuits have not been described in detail, so as not to obscure the present invention. Further, the presently preferred embodiments disclosed are for exemplary purposes only and other embodiments may be employed in lieu of or in combination with the embodiments disclosed.

1. Exemplary Architecture

Figure 1:
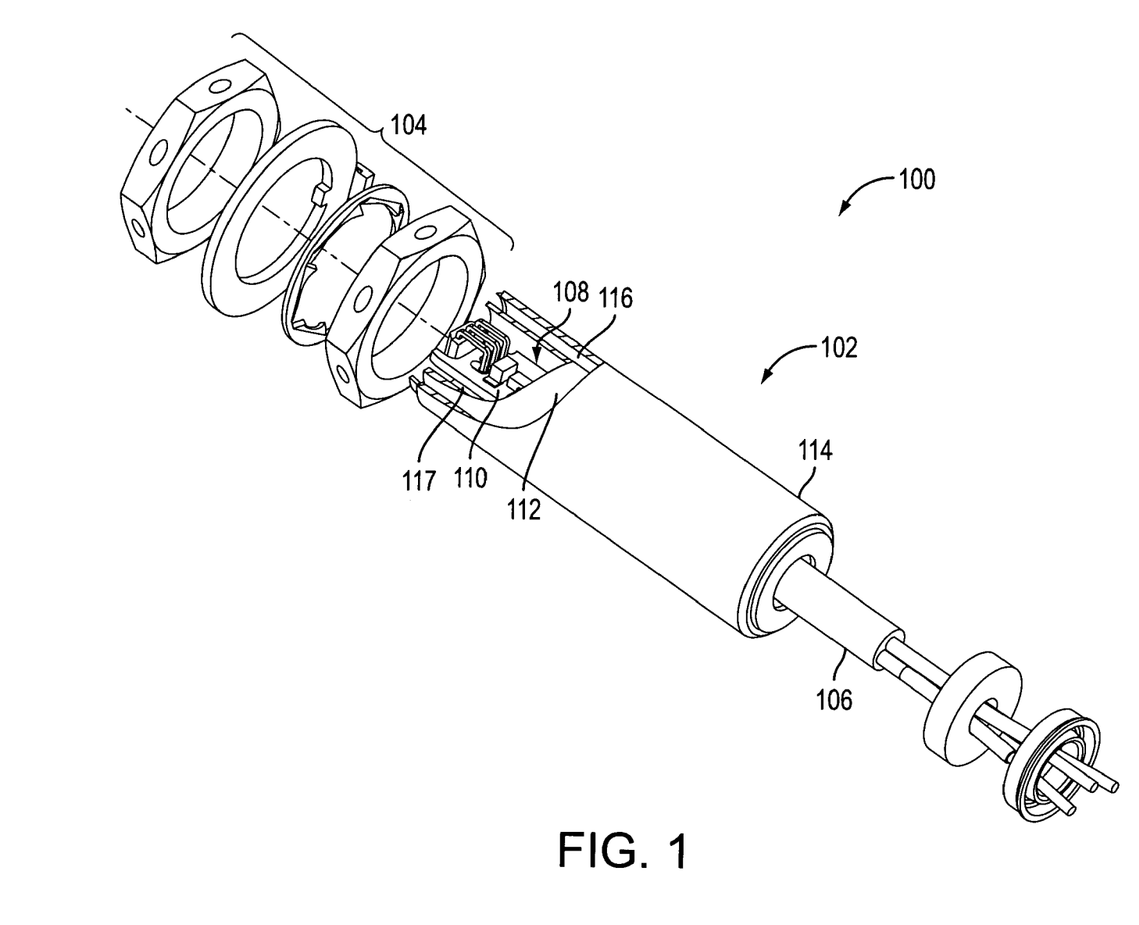
FIG. 1 illustrates an isometric view of a partially-exploded packaging system for electronic circuitry in accordance with an exemplary embodiment.

FIG. 1 illustrates an isometric view of an electronic module 100 incorporating a packaging system in accordance with an exemplary embodiment. The exemplary electronic module 100 shown in FIG. 1 includes a packaging system 102 and mounting hardware 104 for mounting the packaging system 102 to an external device, such as an aircraft. The electronic module 100 also includes a termination cable 106. The termination cable 106 may electrically couple electronic circuitry 108 encased within the packaging system 102 to an external device, such as a controller, which may be placed, mounted, and/or otherwise fixed aboard an aircraft.

The electronic circuitry 108 may be disposed upon a base or substrate 110, which can be encased or otherwise surrounded by one or more components of the packaging system 102. In one embodiment, the packaging system 102 may include (i) an inner housing 112 that can encase or otherwise enclose the substrate 110 within its confines, (ii) an outer housing 114 that in turn encases or encloses the inner housing 112 and the substrate 110 combination within its confines, and (iii) a gap 116 that is positioned between the inner and outer housings 112, 114. This gap 116 may be filled with insulating media, such as air. The combination of the inner housing 112, the outer housing 114, and the gap 116 can insulate the electronic circuitry 108 from the detrimental and destructive heating effects when the packaging system 102 experiences short-term exposure (e.g., 5 to 15 seconds) to a high temperature (e.g., 425 degrees C.), thereby allowing the electronic circuitry 108 to maintain operability before, during and after such exposure.

Figure 2:
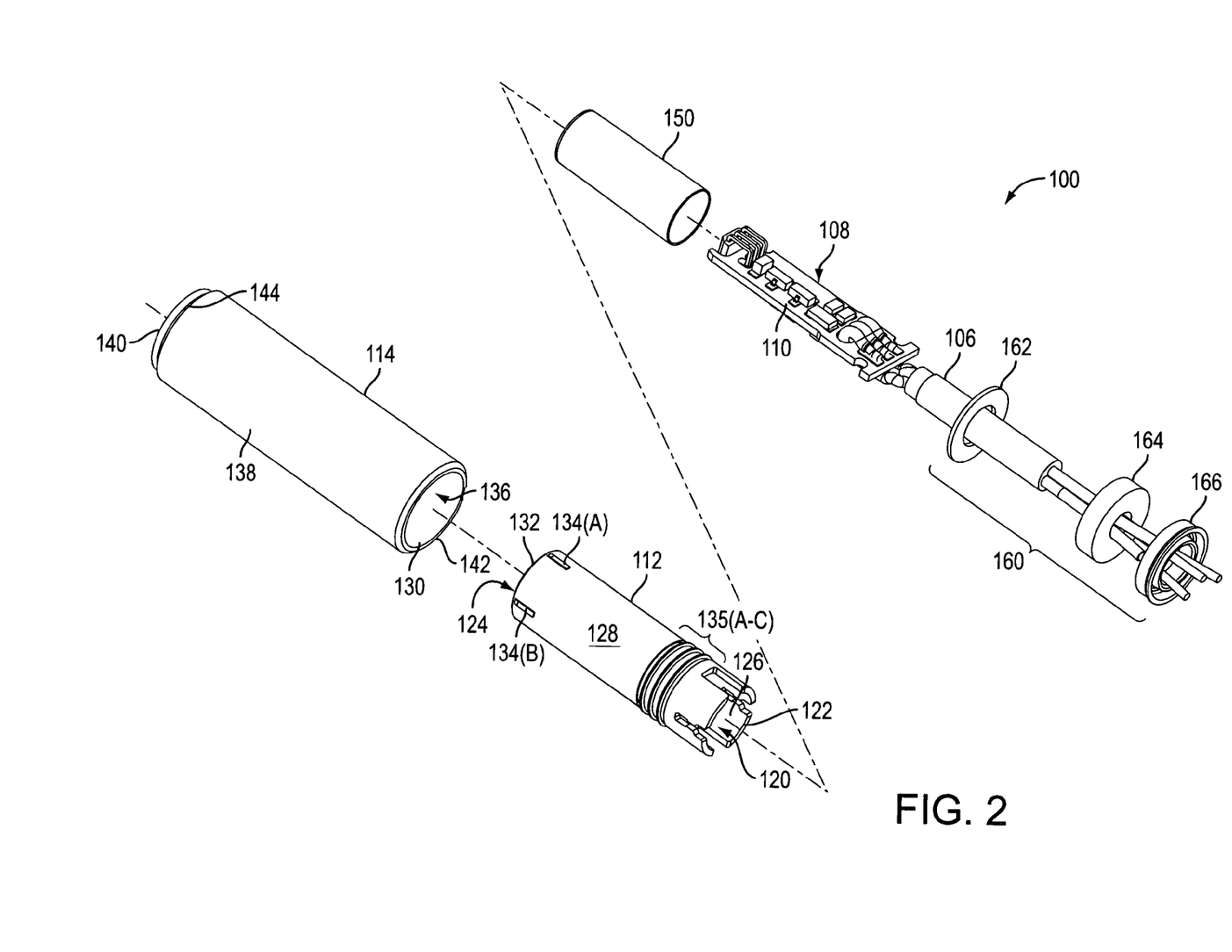
FIG. 2 illustrates an exploded isometric view of the assembled packaging system for electronic circuitry of FIG. 1 in accordance with an exemplary embodiment.

FIG. 2 illustrates an exploded view of the electronic module 100 shown in FIG. 1. With reference to FIG. 2, the substrate 110 may be fabricated from silicon, ceramic, circuit board material (e.g. FR4/G10), flex-tape and/or any other base upon which the electronic circuitry 108 may be formed, deposited, and/or grown. As illustrated in FIG. 2 in an exemplary form, the substrate may be a dual-sided, multi-layered, printed circuit board.

The electronic circuitry 108 may be any type of electronic circuitry, including microprocessor, radio-frequency, power-supply, regulator, sensing, and other integrated, monolithic, and/or discrete circuitry. In one exemplary embodiment, the electronic circuitry 108 may include proximity sensing circuitry and associated functional-adjustment electronics that can be deployed to detect the presence and/or the distance of a metal object from the electronic module 100.

The electronic circuitry 108, for instance, may include one or more (i) proximity-sensing elements that perform the actual detection and provide responsive sensing signals (e.g., discrete signals for present/not present or analog/proportional signals for distance detection measurements); (ii) temperature compensating elements for minimizing and/or eliminating temperature effects so as to stabilize the output the proximity-sensing elements as the temperature of the electronic module 100 varies; and (iii) amplifier elements to amplify and filter the sensing signals. This type of electronic circuitry may be deployed in an aircraft wheel bay to sense the presence (or lack thereof) of the bay door to determine the position (e.g., open or closed) of the bay door for take-off and landing.

Other sensing elements, such as magnetoresistive-sensing elements, potentiometric-sensing elements and ultrasound-sensing elements, may be used in place of or in addition to the exemplary proximity-sensing elements. If such other sensing circuitry is used, the electronic circuitry 108 may include additional and/or different functional-adjustment circuitry to be commensurate with the sensing elements. In another alternative, the electronic circuitry 108 may only include the sensing element, whereby the sensing signals produced by the sensing element are sent to a remote location where the functional-adjustment circuitry resides. Other configurations are possible as well.

With reference again to FIG. 2, the inner housing 112 defines an inner-housing cavity 120. The confines of the inner-housing cavity 120 may be used for encasing the combination of the substrate 110 and electronic circuitry 108.

The inner housing 112 may be fabricated from various materials. These materials may include plastic, ceramic, or metallic materials, amalgamations and combinations thereof, and other materials having low thermal conductivity. The inner-housing 112 may be formed into various configurations using known fabrication processes, such as molding, casting, machining, punching, and/or other forming techniques. In one exemplary embodiment, the inner housing 112 is fabricated from an injection-molded, 20% glass filled, low viscosity polyetherimide thermoplastic having a post-molding melting point no less than 209 degrees Celsius (C.).

Table 1 lists the raw-form characteristics of an exemplary thermoplastic that may be used to fabricate the inner housing 112. These characteristics are listed for exemplary purposes only. Other materials having similar or different characteristics may be used as well. In addition, other molding or fabrication processes may be used in addition to or in lieu of injection molding.

TABLE 1

Thermoplastic characteristics (plastic carrier)

| | |
|---|---|
| Material Type: | Thermoplastic |
| Description: | 20% glass filled, low-viscosity polyetherimide |
| CTE (ppm/C): | 25 |
| Dielectric strength (V/mil): | 670 |
| Elongation at yield (%): | 3.0 |
| Shear strength (ksi): | 13.7 |
| Specific gravity: | 1.42 |
| Temperature deflection (C.): | 209 |
| Tensile strength (ksi): | 20.3 |
| Volume resistivity (ohm-cm): | $7.0 \times 10^{16}$ |

While its shape may take on various configurations, the inner housing 112 may be formed into an exemplary cylindrical shape as shown in FIG. 2. The cylindrically shaped inner housing 112 may have a proximate end 122 and a distal end 124. The opening for the inner-housing cavity 120 can occur at the proximate end 122. The cylindrically shaped inner housing 112 also includes inner and outer surfaces 126, 128, respectively. To separate the inner housing 112 from the outer housing 114, disposed on the outer surface 128 are one or more protrusions. When the inner housing 112 is encased in or otherwise surrounded by the outer housing 114, the protrusions may contact an inner surface 130 of the outer housing 114.

The size, shape, and number of the protrusions may be varied to reduce heat transfer emanating from the outer housing 114 when the outer housing 114 (and the electronic module 100) experiences a short term exposure to the high temperature. The feature size and shape along with the number of the protrusions, however, may be interrelated. As such, this may mean that changing one of these characteristics might require changing another.

For instance, in one exemplary embodiment, the feature size of each of the protrusions may be minimized to reduce heat transfer from the outer housing 114, and the shape of each of the protrusions may be selected to disperse heat to minimize contact area with the outer housing 114. Doing so, however, may cause the number of protrusions to be greater than the number of protrusions in other embodiments having larger feature sizes.

Alternatively, the size, shape, and number of protrusions may be varied to balance the structural separation between the inner and outer housings 112, 114 and heat transfer reduction. The size, shape, and number of protrusions may be varied for other reasons (e.g., cost and complexity of manufacture) as well.

In the exemplary cylindrically-shaped inner housing 112 configuration shown in FIG. 2, the protrusions include (i) one or more first pedestals (also referred to as standoffs) 132 located on the distal end 124, (ii) one or more second pedestals 134(A–B), axially located on the circumference of the outer surface 128 at or near the distal end 124, and (iii) one or more rings 135(A–C) radially located on the circumference of the outer surface 128 at or near the proximate end 122.

In an embodiment that deploys more than one standoff, the first and second pedestals 132, 134(A–B) may be evenly spaced apart over the circumference of the outer surface 128. These first and second pedestals 132, 134(A–B) may intersect at the interface between the distal end 124 and the cylindrical portion of the outer surface 128 of the inner housing 112, thereby forming continuous pedestals.

Like the inner housing 112, the outer housing 114 may be fabricated from various materials. These materials may include metal, plastic, or ceramic, and/or other materials, amalgamations and combinations thereof. The outer housing 114 may be formed into various configurations using known fabrication processes, such as molding, casting, machining, punching, and/or other forming techniques. These various configurations may or may not mimic the shape of the inner housing 112.

In one exemplary embodiment, the outer housing material is selected from a group of materials having low thermal conductivity, such as ceramic. Such selection may provide an insulating barrier against high temperatures in addition to resistance to harsh environmental conditions, and material compatibility with the same and dissimilar materials of mounting locations for the electronic module 100. Because of its brittle character, however, a ceramic outer housing may limit the breadth of application possibilities.

In another exemplary embodiment, the outer housing 114 is machined from a material having a higher thermal conductivity, such as aluminum or stainless steel. These materials may provide such benefits as structural rigidity in addition to the criterion noted above. The benefits of structural rigidity may be realized in commercial and military aircraft applications, where mounting locations and operation of the aircraft places physical stresses on the electronic module 100 that may necessitate such criterion.

In one such exemplary embodiment, the outer housing 114 is machined from stainless steel rod. Table 2 lists the characteristics of this exemplary outer housing. The characteristics are listed for exemplary purposes only. Other materials having similar or different characteristics may be used as well.

TABLE 2

| Stainless steel outer housing characteristics | |
|---|---|
| Material: | 303 stainless steel, annealed |
| Length: | 1.500 inch |
| Diameter: | 0.469 inch |
| Thread: | 15/32 - 32 UNS - 2A |
| Passivation: | Nitric 1 per ASTM A967 |

In the exemplary embodiment shown in FIG. 2, the outer housing 114 is cylindrical. The cylindrical outer housing has an outer surface 138, a distal end 140 and proximate end 142. Like the inner housing 112, the outer housing 114 defines a cavity 136 ("outer-housing cavity"). This outer-housing cavity 136 is formed to encase or otherwise surround the inner housing 112. The outer housing 114 may be formed directly around the inner housing 112; e.g., molding the outer housing 114 around the inner housing 112.

Alternatively, the outer-housing cavity 136 may be formed with an opening. The opening of the outer-housing cavity 136 may be located in the proximate end 142 of the outer housing 114. As such, the inner housing 112 may be inserted (e.g., pressed) into the outer-housing cavity 136 through this opening so that the inner and outer housing 112, 114 are in a coaxial arrangement. When inserted, the protrusions of the inner housing 112 or the inner housing itself 112 may be in a loose fit, a slip fit, or an interference fit with the outer-housing cavity 136.

In the exemplary embodiment shown in FIG. 2, the outer-housing cavity 136 may likewise be formed into a cylindrical shape. Thus, when the inner housing 112 is inserted in the outer-housing cavity 136, (i) some or all the first pedestals may contact its distal end 144, and (ii) some or all the second pedestals along with some or all of the rings 135(A–C) may contact its inner surface 130.

Referring to FIGS. 1 and 2 together, disposed between the inner and outer housing 112, 114 is the gap 116, which may be filled with an insulating media. The insulating media may be, for example, a fluid such as air, a solid, such as ceramic, or some combination of fluids and solids. This gap 116 may be formed into various configurations; each configuration having different physical proportions (e.g., length, width, height) that have potentially different volumes for holding the insulating media.

In one exemplary configuration, the gap 116 is disposed between the cylindrically-shaped outer-housing cavity 136 and the outer surface 128 of the inner housing 112 after the inner housing 112 is encased within the outer housing 114. The boundaries of the gap 116 may be delineated by the separation of the inner housing 112 from the outer housing 114 that results from the contact of (i) the first pedestals 132 with distal end 144 of the outer-housing cavity 136, (ii) the second pedestals 134(A–B) to the inner surface 130 of the outer-housing cavity 136, and (iii) the rings 135(A–C) with the inner surface 130 of the outer-housing cavity 136.

As noted above, the size, shape and number of the protrusions (e.g., first pedestals 132, second pedestals 134(A–B) and rings 135(A–C)) may be varied, which in turn may vary the size and shape of the gap 116. These variations may be deployed to reduce heat transfer from the outer housing 114 and/or to balance the structural separation between the inner and the outer housings 112, 114 to insulate electronic circuitry from adverse temperature conditions when experiencing short term exposure to the high temperature.

Also affecting the size and shape of the gap 116 is the type of insulating media. If, for example, the insulating media has a low thermal conductivity, then the amount (e.g., volume) of low-thermal-conductivity insulating media may be less than an insulating media having a high thermal conductivity. Thus, in this exemplary case, the size and shape of the gap 116 (i.e., the separation between the inner and outer housings) may vary along a sliding scale in accordance with the thermal conductivity of the media type. Along this scale, a smaller gap 116 may be used when the insulating media has a low thermal conductivity and a larger separation may be used when the insulating media has a high thermal conductivity. In addition, the materials comprising the inner and outer housings 112, 114 may affect the size, shape of the gap 116 as well.

Table 3 below lists exemplary dimensions and materials of the inner housing 112, the outer housing 114, and the gap 116. These dimensions are listed for exemplary purposes only. Other configurations having similar or different dimensions may be used as well.

In addition to the inner and outer housings 112, 114, an electromagnetic-interference and radio-frequency-interference shield 150 (EMI/RFI shield) may also included in the packaging system 102. EMI and RFI cause electrical disturbances in systems. These disturbances are due to natural phenomena, low-frequency waves from electromechanical devices or high-frequency waves (RFI) from other electronic devices. Generally, the allowable limits of EMI/RFI are governed by the Federal Communication Commission or other governing body. In large systems, such as an aircraft, in which many electronic subsystems are co-mingled, EMI/RFI noise may disrupt or cause undesirable effects to the electronic circuitry contained within the electronic module 100. To reduce or eliminate EMI, EMI shields, such as EMI shield 150, may be included.

The EMI shield 150 may be fabricated from various materials. These materials may include various conductive metals, laminates, amalgamations and combinations thereof. Generally, the EMI/RFI shield 150 is connected to a ground node of the electronic circuitry 108 and sinks undesired EMI/RFI to that node.

Shielding laminates may consist of a metal foil combined with a plastic insulating film. These parts are joined under pressure using an acrylic adhesive. The foil provides the shielding properties and the insulator prevents any electrical shorting with components or the circuit boards. The insulator adds rigidity to the final design. Materials may be selected based on the form, fit and function of the shield. These shields may be designed and manufactured in various shapes and sizes.

Alternatively, the EMI/RFI shield 150 may be formed from punched steel, copper, aluminum, and/or other electrically-conductive material. The EMI/RFI shield 150 may be molded into the inner housing 112 or be designed so that the

TABLE 3

| Inner Housing 112 | | | Injection-molded plastic |
|---|---|---|---|
| | Outer surface 128 | Length: 1.133 inch | |
| | | Diameter: 0.350 inch | |
| | Inner housing cavity 120 | Length: 1.113 inch | |
| | | Diameter: 0.290 inch | |
| | First pedestals 132 | No.: 4; each having | |
| | | Length: 0.025 inch | |
| | | Width: 0.020 inch | |
| | | Height: 0.005 | |
| | Second pedestals 134 | No.: 4; each having | |
| | | Length: 0.114 inch | |
| | | Width: 0.025 inch | |
| | | Height: 0.005 | |
| | Rings 135(A–C) | No.: 3; each having | |
| | | Width: 0.015 inch | |
| | | Height: 0.013 | |
| Outer housing 114 | | | 303 Stainless Steel |
| | Outer surface 138 | Length: 1.500 inch | |
| | | Diameter: 0.469 inch | |
| | Outer housing cavity 136 | Length: 1.475 inch | |
| | | Diameter: 0.360 inch (typical) | |
| Gap 116 | | Volumetric difference between inner surface 130 of outer housing cavity 136 and outer surface 128 of inner housing cavity 120 less volume of the first pedestals 132, second pedestals 134, and rings 135: 0.006651 cubic inches | Air, ceramic, other fluid or solid. | shield's material does not short to the electronic circuitry. For instance, the EMI/RFI shield 150 or the electronic circuitry may be sprayed or otherwise coated with an insulating coating to prevent electrically shorting with the electronic circuitry. The EMI/RFI shield 150 is not limited to these materials, and other materials having similar or different characteristics may be used as well. In addition, other fabrication processes may be used in addition to or in lieu of punching and molding.

The EMI/RFI shield 150 may be formed into an exemplary cylindrical shape as shown in FIG. 2. The cylindrically-shaped EMI/RFI shield 150 may have a proximate end and a distal end. An opening for accepting the substrate 110 can occur at the proximate end of the EMI/RFI shield 150. The cylindrically shaped EMI/RFI shield 150 also has inner and outer surfaces. When assembled, the inner and outer surfaces of the EMI/RFI shield 150 may be in a loose fit, a slip fit, or an interference fit with the substrate 110 and the inner-housing cavity 120, respectively. Other configurations are possible as well.

If the inner housing 112 does not hermetically seal the combination of the substrate 110 and electronic circuitry 108, as in the case of molding the inner housing 112 directly over the combination, a second gap 117 may be deployed between the substrate 110 and the inner-housing cavity 120. This second gap 117 may be filled with an insulating media. Like the gap 116, the insulating media may be a fluid, such as air, a solid, such as cured silicone adhesive, or some combination of fluids and solids. The second gap 117 may be deployed in addition to or in lieu of the gap 116.

Also illustrated in FIG. 2 is a sealing system 160. The sealing system 160 may include one or more sealing mechanisms that seal the substrate within the inner-housing cavity 120 and the proximate ends of the inner and outer housings 122, 142, but let the termination cable 106 pass through to the outside world. In an exemplary embodiment, the sealing system 160 includes a washer 162, a grommet 164, and bushing 166.

Materials for the washer 162, the grommet 164, and the bushing 166 may be selected based on the form and fit between (i) the substrate 110 and the inner housing 112, (ii) the inner housing 112 and the outer housing 114, and (iii) the termination cable 106 and the sealing system 160. In an exemplary embodiment, the washer 162 may be fabricated from stainless steel, the grommet 164 may be fabricated from silicon or a silicon-rubber amalgamation, and the bushing 166 may be fabricated from stainless steel. Other materials may be used as well.

2. Exemplary Assembly of the Electronic Module

Figure 3:
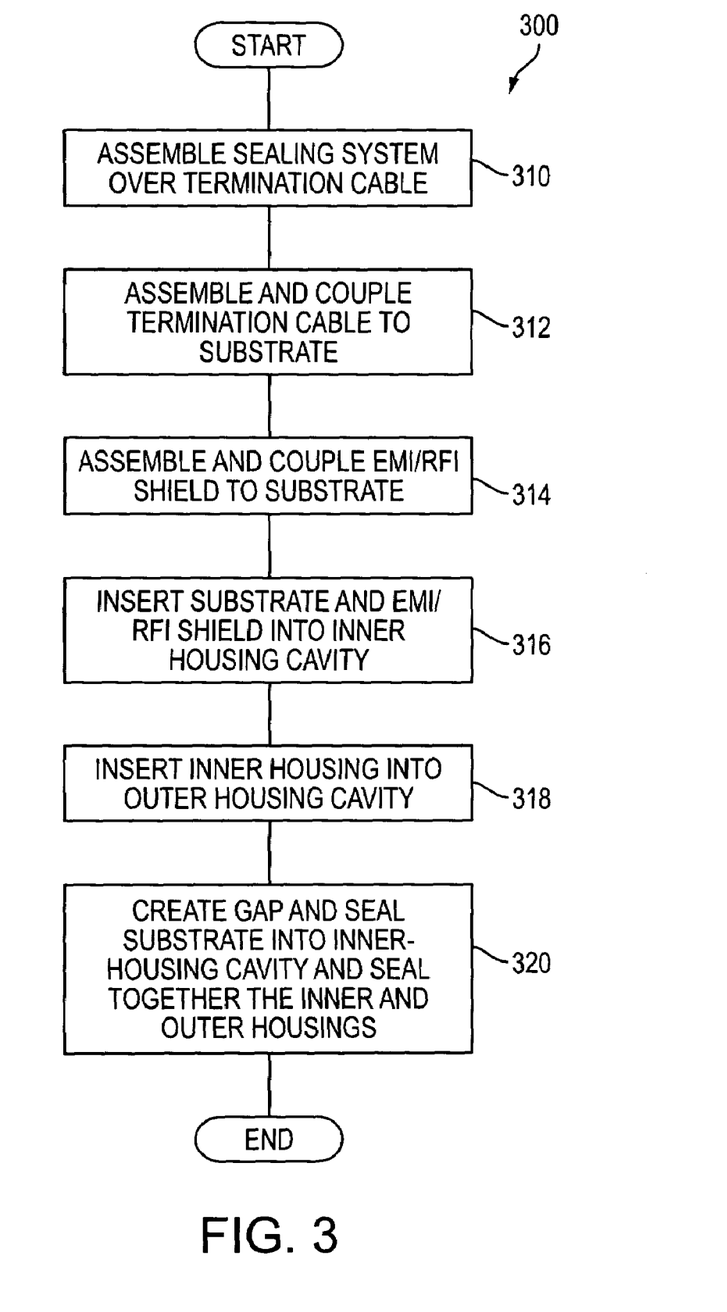
FIG. 3 illustrates a flow chart for assembling the packaging system of the electronic circuitry illustrated in FIGS. 1 and 2 in accordance with an exemplary embodiment.

FIG. 3 illustrates a flow chart 300 for assembling the electronic module 100 as shown in FIGS. 1 and 2 in accordance with an exemplary embodiment. The following description for assembling the electronic module 100 uses the reference numerals of the components shown in FIG. 2.

With reference to FIG. 3, at block 310, the sealing system 160 is assembled or otherwise arranged over the termination cable 106. This may entail loosely inserting the termination cable 106 through the washer 162, grommet 164, and bushing 166 to prepare for later sealing.

At block 312, the termination cable 106 is assembled and coupled to the substrate 110. In an exemplary embodiment, the termination cable 106 is routed through the substrate 110 (e.g., a printed circuit board) leaving enough of the cable for strain relief when soldered thereto. The termination cable 106 may be routed through the substrate 110 to protect against vibration, thermal expansion, and other mechanical stresses that may affect solder joints at the interface of the substrate 110 and the termination cable 106. The termination cable may be assembled and coupled to the substrate in other ways as well.

At block 314, the EMI/RFI shield 150 may be assembled over and coupled to the substrate 110. This may involve positioning the EMI/RFI shield 150 over the substrate 110 and soldering the shield to a ground node on the substrate 110. As noted above, the EMI/RFI shield 150 may be molded into or otherwise incorporated into the inner housing 112. As such, this step may be omitted, but the EMI/RFI shield 150 may still need to be connected to the substrate 110 when the substrate is inserted or otherwise encased in the inner housing 112.

At block 316, the substrate 110 is inserted or otherwise encased in the inner housing 112. The assembly may be performed using a mechanically-advantaged (e.g., lever), hydraulic, or air-powered press, and/or other insertion tool or tooling. If the EMI/RFI shield 150 is assembled and coupled to the substrate 110, this combination may be inserted in the inner-housing cavity 120. In practice, the combination of the EMI/RFI shield 150 and the substrate 110 is in a slip fit to interference fit with the inner surface 126 of the inner housing cavity 120.

To insert or "press" the combination into the inner-housing cavity 120, a lubricating sealant, such as temperature-curable-silicon-passivating gel, may be used on the inside surface 126 and over the substrate 110 to ease the installation and protect the electronic circuitry from environmental hazards. Such lubricant may be used when inserting the substrate 110 into the inner-housing cavity 120 regardless of whether the EMI/RFI shield is molded or otherwise encased into the inner housing 112.

In this exemplary configuration, the second gap 117 is deployed and disposed between the substrate 110 and the inner-housing cavity 120. This second gap 117 may be filled with a combination of air and scant amounts of curable silicone adhesive. If desired, the assembly of the combination of the substrate 110 and electronic circuitry 108 into the inner housing 112 may be performed in a vacuum chamber, whereby once inserted and sealed, the second gap 117 may comprise a combination of curable adhesives and a vacuum. When deploying the second gap 117, the combination of the inner housing 112, the outer housing 114, the gap 116 and/or the second gap 117 may insulate the electronic circuitry, which allows the electronic circuitry 108 to maintain operability before, during and after the packaging system 102 experiences short term exposure to the high temperature.

At block 318, the inner housing 112 is coaxially encased or otherwise inserted into the outer housing 114. In practice, the inner housing 112 is mechanically "pressed" into the outer housing 114 using a lever-advantaged, hydraulic and/or air-powered press such that the protrusions of the inner housing 112 are in a slip fit to interference fit with the inner surface 130 of the outer-housing cavity 142. Like the substrate 110 to inner-housing cavity 126 insertion process, a lubricant, such as silicon gel, may be used to ease the installation of inner housing 112 into the outer-housing cavity 142. As before, the lubricant may be used on the inner surface 130 of the outer-housing cavity 142 and/or on the outer surface 128 of the inner housing.

At block 320, the sealing system 160 may be assembled into place after inserting the inner housing 112 into the outer housing 114. In assembling the sealing system 160, the combination of the substrate 110 and electronic circuitry 108, but not the termination cable, may be sealed into the inner-housing cavity 122 by forcing and bonding (using, for example, adhesive or heat-melt processing) of the washer 162 or other sealing mechanisms up-against the proximate end 122 of the inner-housing cavity 120 and/or the inner-surface 130 of the outer housing 114. As noted above, this can be done under a vacuum. Alternatively, portions of the sealing system 160 may have been deployed at block 316 when sealing the combination of the substrate 100 and electronic circuitry into the inner-housing cavity 120.

After sealing the combination of the substrate 110 and electronic circuitry, the grommet 164 and bushing 166 along with curable adhesive (e.g., high-temperature curable epoxy) may be pressed or otherwise inserted into the proximate end 142 of the outer housing 114. In such a construction, the rings 135(A–C) are beneficially in slip or interference fit against the inner surface 130 of the outer housing 114. This can prevent the curable adhesive from flowing into the gap 116 when the adhesion inhibitor is expulsed during a time and/or temperature cure. Like the washer 162, the grommet 164 and bushing 166 can seal together the proximate ends of the inner and outer housings 122, 142, but let the termination cable 106 pass through.

In assembling the sealing system 160 as just described, the gap 116 is deployed and disposed between the outer surface 128 of the inner-housing 112 and the inner-surface 130 of the outer housing 114, and may be filled with air and scant trances of curable silicone passivation. If desired, however, the assembly of the sealing system 160 to the combination of the inner housing 112, outer housing 114, and substrate 110 may be performed in a vacuum chamber, whereby once inserted and sealed, the gap 116 may be evacuated and contain a vacuum.

The arrangement and assembly of the combination of (i) the inner housing 112, (ii) the outer housing 114, (iii) the gap 116, and/or (iv) the second gap 117 may overcome some or many of the detrimental temperature hazards to electronic circuitry 108, thereby allowing the circuitry to operate efficiently over a wide range of threshold temperatures. The combination (i)–(iv) may expand the range of threshold temperatures that would be otherwise exhausted by the internal temperature of the electrical components and the radiant temperature of other surrounding electronics. Further, the combination allows the electric circuitry 108 to experience external temperatures above traditional failure point temperatures, which opens up the vast possibilities of using the electronic module 100 in many desirable, harsh environmental locations.

When the combination (i)–(iv) above experiences short term exposure to high temperatures that would otherwise cause the temperatures of the electronic components to rise above the operational-threshold temperatures and fail, the combination may allow the junctions of silicon devices to survive and operate throughout the exposure, prevent solder pads from reflowing, prevent thermistors and other temperature sensing components from becoming unstable, reduce the malleability of the substrate 110, and avoid other electromechanical failures.

3. Experimental Results

Table 4 below lists the operating characteristics of eight exemplary samples of the electronic module 100 embodied as a proximity sensor. As such, the electronic module 100 includes proximity sensing elements and associated function adjustment circuitry. For each of the samples, the operating position ("o.p."), release position ("r.p."), voltage drop or "saturation voltage" ("Vsat"), current burden during actuation of the electronic circuitry 108 ("I burden Act."), and current burden during de-actuation of the electronic circuitry 108 ("I burden Deact.") are shown.

The operating position may be defined as the point or points at which the proximity sensor detects the presence of an object and/or the distance of the object from some reference point. These points may be measured from the distal end 140 of the outer housing 114, i.e., the reference point of the proximity sensor. The release position may be defined as the point or points at which the proximity sensor no longer detects an object. Like the operating position, these points may be measured from the reference point of the proximity sensor.

The saturation voltage may be defined as a voltage dropped across a load coupled to the output of the electronic circuitry 108. This voltage drop or saturation voltage will often vary with the amount of current going through an output section of the electronic circuitry 108 and the load. It should be specified with current conditions. Accordingly, the table lists the current burden to actuate the electronic circuitry 108 and current burden to deactivate the electronic circuitry 108 are shown.

TABLE 4

(These characteristics are listed for exemplary purposes only)
Sample Units
Sample Units 1 and 2 were built without a shielded cable assembly;
Tested w/magnet mounted to 2 × 2 × 5 inch CRS
(cold rolled steel) Vsat measure with V = 28 v @ 20 ma.

|   | o.p (inches) | r.p. (inches) | Vsat (volts) | I burden Act. (ma) | I burden Deact (ma) |
|---|---|---|---|---|---|
| 1 | 0.286 | 0.35  | 0.8   | 13.85 | 13.42 |
| 2 | 0.287 | 0.347 | 0.818 | 13.88 | 13.41 |
| 3 | 0.297 | 0.35  | 0.815 | 13.66 | 13.24 |
| 4 | 0.306 | 0.37  | 0.8   | 13.81 | 13.35 |
| 5 | 0.284 | 0.339 | 0.799 | 13.78 | 13.35 |
| 6 | 0.284 | 0.33  | 0.799 | 13.72 | 13.29 |
| 7 | 0.306 | 0.359 | 0.804 | 13.58 | 13.12 |
| 8 | 0.289 | 0.352 | 0.818 | 13.75 | 13.31 |
| 9 | 0.306 | 0.367 | 0.818 | 13.65 | 13.11 |

4. Conclusion

In view of the wide variety of embodiments to which the principles of the present invention can be applied, it should be understood that the illustrated embodiments are exemplary only, and should not be taken as limiting the scope of the present invention. The operation described above may be performed in sequences other than that described, and more or fewer elements may be used in the block diagrams.

Further, the claims should not be read as limited to the described order or elements unless stated to that effect. In addition, use of the term "means" in any claim is intended to invoke 35 U.S.C. §112, ¶ 6, and any claim without the word "means" is not so intended. Therefore, all embodiments that come within the scope and spirit of the following claims and equivalents thereto are claimed as the invention.

Preferred and alternative embodiments of the present invention have been illustrated and described. It will be understood, however, that changes and modifications may be made to the invention without deviating from its true spirit and scope, as defined by the following claims.

We claim:

1. A packaging system for electronic circuitry, wherein the electronic circuitry is disposed on a substrate, the packaging system comprising in combination:
   an inner housing surrounding the substrate;
   an outer housing surrounding the inner housing and the substrate; and
   a gap positioned between the inner and outer housings, the gap filled with air, whereby when the packaging system experiences short term exposure to a high temperature, the combination of the inner housing, the outer housing, and the gap allow the electronic circuitry to maintain operability.

2. A packaging system for electronic circuitry, wherein the electronic circuitry is disposed on a substrate, the packaging system comprising in combination:
   an inner housing surrounding the substrate;
   an outer housing surrounding the inner housing and the substrate; and
   a gap positioned between the inner and outer housings, the gap filled with insulating media, whereby when the packaging system experiences short term exposure to a high temperature, the combination of the inner housing, the outer housing, and the gap allow the electronic circuitry to maintain operability, and wherein the electronic circuitry comprises sensing electronics.

3. The system recited in claim 2, wherein the sensing electronics comprises a proximity sensor.

4. The system recited in claim 3, wherein the proximity sensor comprises a sensing element selected from the group consisting of a hall-effect sensing element, a magnetoresistive-sensing element, a potentiometric-sensing element and an ultrasound-sensing element.

5. A packaging system for electronic circuitry, wherein the electronic circuitry is disposed on a substrate, the packaging system comprising in combination:
   an inner housing fabricated from material having low thermal conductivity, the inner housing defining a first cavity for accepting the substrate, the inner housing including an outer surface having at least one protrusion extending away from the outer surface;
   an outer housing defining a second cavity for accepting the inner housing and substrate, the second cavity including an inner surface for contacting the at least one protrusion extending from the outer surface of the inner housing; and
   a gap positioned between the outer surface of the inner housing and the inner surface of the outer housing, the gap filled with an insulating media, whereby when the packaging system experiences short term exposure to a high temperature, the combination of the inner housing, the outer housing, and the gap allow the electronic circuitry to maintain operability,
   wherein the inner housing is substantially cylindrical and has distal and proximate ends, the proximate end having an opening for the first cavity,
   wherein at least one protrusion from the outer surface of the inner housing defines (i) at least one first pedestal located on the distal end, (ii) a plurality of second pedestals located axially on the outer surface of the inner housing close to the distal end, and (iii) at least one ring located radially on the outer surface of the inner housing close to the proximate end,
   wherein the inner surface of the second cavity of the outer housing defines a cylindrical portion having distal and proximate ends, the proximate end having an opening for the second cavity, wherein when the inner housing is inserted in the outer housing, (i) at least one first pedestal contacts the distal end of the second cavity, (ii) the plurality of second pedestals contact the inner surface of the second cavity, and (iii) the at least one ring contacts the inner surface of the second cavity, and
   wherein the gap filled with insulating media defines a region between the outer surface of the inner housing and the inner surface of the outer housing when the inner housing is inserted in the outer housing.

6. The system recited in claim 5, wherein the substrate has distal and proximate ends, wherein when the substrate is accepted into the first cavity, the distal end of the substrate is close to the distal end of the first cavity and the proximate end of the substrate is close to the proximate end of the first cavity, and wherein the electronic circuitry comprises sensing electronics having a termination cable for coupling the sensing electronics to an external device, the termination cable protruding from the proximate end of the first cavity when the substrate is accepted into the first cavity.

7. The system recited in claim 6, further comprising at least one seal for sealing (i) the substrate within the first cavity, and (ii) the proximate ends of the inner and outer housings to each other, and wherein the termination cable passes through the seal.

8. A packaging system for electronic circuitry, wherein the electronic circuitry is disposed on a substrate, the packaging system comprising in combination:
   an inner housing fabricated from material having low thermal conductivity, the inner housing defining a first cavity for accepting the substrate, the inner housing including an outer surface having at least one protrusion extending away from the outer surface;
   an outer housing defining a second cavity for accepting the inner housing and substrate, the second cavity including an inner surface for contacting the at least one protrusion extending from the outer surface of the inner housing;
   a gap positioned between the outer surface of the inner housing and the inner surface of the outer housing, the gap filled with an insulating media;
   a second gap positioned between the first cavity and the substrate, the second gap filled with insulating media, and the second gap providing an additional insulating layer; and
   an electromagnetic interference shield positioned between the outer surface of the inner housing and the substrate, the electromagnetic interference shield surrounding at least a portion of the substrate, whereby when the packaging system experiences short term exposure to a high temperature, the combination of the inner housing, the outer housing, the electromagnetic interference shield, and the first and second gaps allow the electronic circuitry to maintain operability.

9. A packaging system for electronic circuitry, wherein the electronic circuitry is disposed on a substrate, the packaging system comprising in combination:
   an inner housing fabricated from material having low thermal conductivity, the inner housing defining a first cavity for accepting the substrate, the inner housing including an outer surface having at least one protrusion extending away from the outer surface;
   an outer housing defining a second cavity for accepting the inner housing and substrate, the second cavity including an inner surface for contacting the at least one protrusion extending from the outer surface of the inner housing;
   a gap positioned between the outer surface of the inner housing and the inner surface of the outer housing, the gap filled with an insulating media, whereby when the packaging system experiences short term exposure to a high temperature, the combination of the inner housing, the outer housing, and the gap allow the electronic circuitry to maintain operability; and
   an electromagnetic interference shield positioned between the outer surface of the inner housing and the substrate, the electromagnetic interference shield surrounding at least a portion of the substrate.

* * * * *